(12) United States Patent
Caille (10) Patent No.: US 9,854,691 B2
(45) Date of Patent: Dec. 26, 2017

(54) ELECTRICAL EQUIPMENT MODULE (71) Applicants: LEGRAND FRANCE, Limoges (FR); LEGRAND SNC, Limoges (FR)

(72) Inventor: Jean-Loup Caille, Peyrilhac (FR)

(73) Assignees: LEGRAND FRANCE, Limoges (FR); LEGRAND SNC, Limoges (FR)

( * ) Notice: Subject to any disclaimer, the term of this patent is extended or adjusted under 35 U.S.C. 154(b) by 77 days.

(21) Appl. No.: 14/653,742

(22) PCT Filed: Dec. 17, 2013

(86) PCT No.: PCT/FR2013/053125
§ 371 (c)(1),
(2) Date: Jun. 18, 2015

(87) PCT Pub. No.: WO2014/096676
PCT Pub. Date: Jun. 26, 2014

(65) Prior Publication Data
US 2016/0198581 A1 Jul. 7, 2016

(30) Foreign Application Priority Data
Dec. 20, 2012 (FR) ...................................... 12 03509

(51) Int. Cl.
*H02G 3/08* (2006.01)
*H05K 5/02* (2006.01)
(Continued)

(52) U.S. Cl.
CPC .......... *H05K 5/0217* (2013.01); *H02G 3/123* (2013.01); *H02G 3/18* (2013.01)

(58) Field of Classification Search
CPC H02G 3/12; H02G 3/18; H02G 3/083; H02G 3/10; H02G 3/08; H02G 3/081;
(Continued)

(56) References Cited

U.S. PATENT DOCUMENTS 3,620,404 A * 11/1971 Grasso ................... E04F 19/08
174/503
3,746,931 A * 7/1973 Muranaka ................ G04F 3/06
174/503
(Continued)

FOREIGN PATENT DOCUMENTS

CN 201725961 1/2011

OTHER PUBLICATIONS

International Search Report, dated Feb. 21, 2014, from corresponding PCT application.

*Primary Examiner* — Angel R Estrada
(74) *Attorney, Agent, or Firm* — Young & Thompson (57) ABSTRACT

The electrical-accessory module (130) for engaging in an electrical box (110) includes a casing (131) that is made of insulating material and that includes:
 a side wall (132) that is closed at the rear by a rear wall (133) so as to define an inside space for receiving at least one electrical connection element; and
 an outer collar (135) that borders the side wall at the front so as to bear against the front edge (115) of the electrical box. The casing further includes a front wall (134) that closes the inside space at the front and that includes:
an access window (137) for accessing each electrical connection element, the access window being closed by trim (139) that gives the electrical-accessory module its electrical function; and
securing elements (138) for securing a finishing plate (150).

20 Claims, 8 Drawing Sheets (51) Int. Cl.
*H02G 3/12* (2006.01)
*H02G 3/18* (2006.01)

(58) Field of Classification Search
CPC ...... H02G 3/123; H05K 13/0023; H05K 5/00; H05K 5/02; H05K 5/0217
USPC ............... 174/50, 53, 57, 58, 502, 480, 481; 220/3.2, 3.3, 3.8, 4.02; 439/535
See application file for complete search history.

(56) References Cited

U.S. PATENT DOCUMENTS

| | | | |
|---|---|---|---|
| 3,879,101 A | | 4/1975 | McKissic |
| 4,636,914 A | * | 1/1987 | Belli ...................... H02G 3/086 174/53 |
| 4,669,804 A | | 6/1987 | Munroe |
| 5,223,673 A | * | 6/1993 | Mason ..................... H02G 3/16 174/53 |
| 7,160,147 B1 | | 1/2007 | Stephan |
| 7,903,412 B2 | * | 3/2011 | Spivey ............... H05K 7/20445 174/520 |
| 7,994,436 B2 | * | 8/2011 | Yamamoto ........... H01R 25/006 174/50 |
| 9,362,729 B2 | * | 6/2016 | Wade ...................... H02G 3/10 |
| 2002/0185296 A1 | | 12/2002 | Schultz et al. |

\* cited by examiner

ELECTRICAL EQUIPMENT MODULE

TECHNICAL FIELD TO WHICH THE INVENTION RELATES

The present invention generally relates to flush mounting electrical accessories in cavities formed in walls.

It relates more particularly to an electrical-accessory module for engaging in an electrical box, said module including a casing that is made of insulating material and that comprises:

a side wall that defines an inside space for receiving at least one electrical connection element; and an outer collar that borders the side wall at the front so as to bear against the front edge of said electrical box.

TECHNOLOGICAL BACKGROUND

Currently, all electrical accessories for flush mounting are similar in structure.

Such an electrical accessory thus comprises: an electrical box that is open at the front and that is for fitting through an opening formed in the hollow partition; an accessory support in the form of a frame for fitting on the open front face of the electrical box; an accessory mechanism (e.g. a power-outlet or a switch mechanism) for blocking in the opening defined by the accessory support; and a finishing plate for fastening on the accessory support so that it hides said accessory support and so that it borders the accessory mechanism in attractive manner.

In particular, the accessory mechanism comprises an insulating block that houses connection terminals for connecting to the local electricity network, and that is closed at the front by a piece of trim that is user-accessible (a toggle or push button for an on/off switch or two-way switch, a connection well for a power outlet, . . . ).

It should be understood that the insulating block, suitable for engaging in the opening of the accessory support, presents a width that is small compared to the diameter of the electrical box, and this restricts the number of functions that the accessory mechanism may have.

In order to install such an electrical accessory in an opening formed in a hollow partition, it is likewise necessary to implement a large number of operations.

It is thus necessary to pull at least one cable-routing conduit through the opening formed in the hollow partition, to engage the end of each conduit in the electrical box, to fasten the electrical box in the opening formed in the hollow partition, pushing each conduit back into the hollow partition, to screw-fasten the accessory support on the electrical box, to connect the electric wires coming from each conduit to the terminals of the accessory mechanism, to block the accessory mechanism in the accessory support, and to fit the finishing plate on the accessory support.

These operations are time-consuming and tricky to perform.

The number of elements necessary for fastening the electrical accessory on the hollow partition is also large, and this is costly.

Document U.S. Pat. No. 3,879,101 discloses an accessory mechanism that is made of two parts, which mechanism comprises a rear casing that is designed to be fastened inside an electrical box, and a front casing that is designed to be mounted on the rear casing or removed from the rear casing.

The rear casing includes side terminals for connecting to electric wires coming from the local electricity network. It also includes two arms that are adapted to be fastened by screw-fastening through two holes provided in the electrical box.

The front casing includes two rear terminals that are adapted to plug into sockets provided in the front of the rear casing. It also includes two flanges, each perforated with an opening for screw-fastening the front casing through two openings provided in the rear casing.

This accessory mechanism does not solve the above-mentioned problem of size. Furthermore, it turns out to be difficult to install in a wall, in particular because it requires the use of a large number of components and screws. In addition, once assembled, there remains a gap between the edge of the front casing and the edge of the electrical box, and elements can become engaged in the gap to the detriment of the electrical safety of the assembly. Finally, the arms of the rear casing that make it possible to fasten the rear casing on the electrical box by screw-fastening, form extra thickness projecting from the front of the electrical box. This extra thickness goes against the object generally desired in the design of an electrical accessory for flush mounting in a wall, namely to design electrical accessories that project little from the front of the wall.

OBJECT OF THE INVENTION

In order to remedy the above-mentioned drawbacks of the prior art, the present invention proposes replacing the accessory mechanism and the accessory support with an accessory module of structure that is simpler and of volume that is larger.

More particularly, the invention proposes an accessory module as defined in the introduction, in which the casing further comprises a front wall that closes said inside space at the front and that includes:

an access window for accessing each electrical connection element, said access window being closed by trim that gives the electrical-accessory module its electrical function; and securing means for securing a finishing plate.

Thus, the front wall presents an accessory-support function, without however restricting the size of the casing that receives the electrical components. It thus does not limit the number of functions that the casing may have.

In addition, by means of the invention, installing the accessory module in the electrical box is easier, since it consists merely in fitting the accessory module directly into the electrical box, without any need for an accessory support.

Other characteristics of the accessory module of the invention that are advantageous and non-limiting are as follows:

said securing means are situated between said access window and said outer collar;

said front wall is formed as a single piece;

said front wall is snap-fastened on said side wall;

said front wall is formed together with at least a portion of said side wall;

said access window is off-center relative to the outline of said front wall;

said side wall presents a shape that is substantially circularly-cylindrical about an axis;

said casing includes at least one deployable member for fastening the casing to said electrical box, which deployable member is movable between a retracted position in which it does not hinder insertion of the casing into said electrical box, and a deployed position in which it is adapted to catch onto said electrical box;

said deployable member is carried by a flexible tab that is cut out in the side wall of the casing;

said deployable member is movable by means that are accessible through said front wall;

the casing includes partitions that are arranged in said inside space, which partitions are formed integrally with a rear wall that closes said side wall at the rear and/or with the side wall, and define a housing for receiving and blocking said electrical-connection element;

a rear wall is provided that closes the side wall of the casing at the rear, and that presents at least one inlet opening for connecting said electrical connection element to the local electricity network;

each electrical connection element comprises a piston terminal that projects at the rear of the rear wall, through said inlet opening;

each electrical connection element comprises a stationary and non-deformable terminal that is situated on the axis of said inlet opening;

said outer collar presents a rear face that slopes outwards; and said outer collar presents a rear face that is serrated at least in part.

DETAILED DESCRIPTION OF AN EMBODIMENT

The following description of non-limiting examples given with reference to the accompanying drawings, makes it possible to understand what the invention consists of and how it can be reduced to practice.

Firstly, it should be observed that elements of the various variant embodiments of the invention shown in the various figures that are identical or similar are, as far as possible, referenced using the same references, and they are not described each time.

Figure 1:
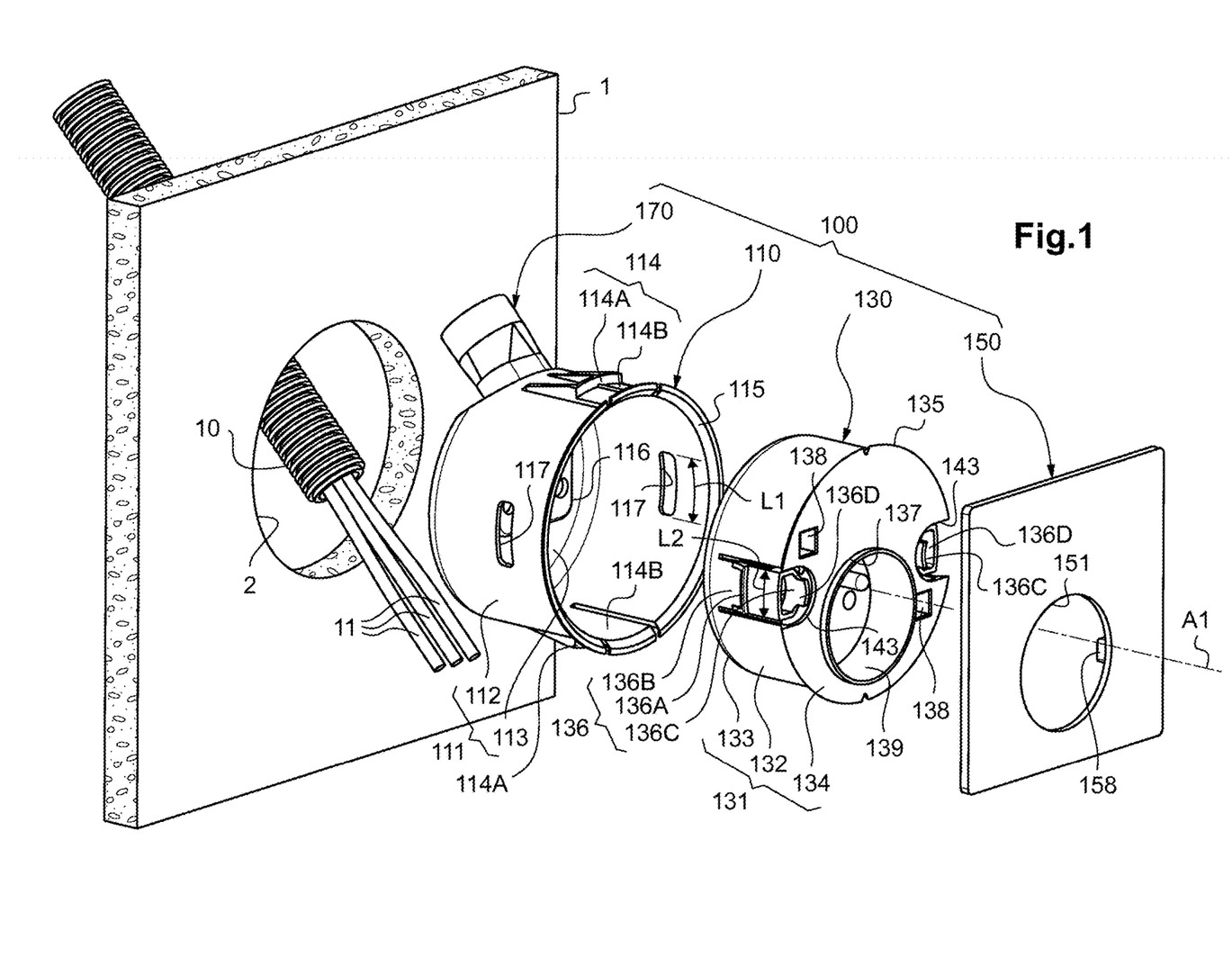
FIG. 1 is an exploded diagrammatic perspective view of an electrical accessory for flush mounting in a hollow partition, said figure showing an electrical-accessory module of the invention, a finishing plate, and an electrical box.

FIG. 1 shows an electrical accessory 100 comprising an electrical-accessory module 130, an electrical box 110, and a finishing plate 150.

The electrical accessory 100 is of the type for flush mounting in a cavity 2 formed in a wall 1.

The electrical box 110 thus makes it possible not only to fasten the electrical-accessory module 130 rigidly in the wall 1, but also to protect it.

The term "electrical-accessory module" means any type of module, such as a power-outlet, an on/off switch, a two-way switch, a dimmer switch, a network connector (RJ45), a telephone socket (RJ11), an indicator-lamp, or a detector (of smoke, flood, temperature, movement, or light).

In the embodiment shown in the figures, the electrical-accessory module 130 is designed more precisely to be flush mounted in a hollow partition.

On this topic, it should be observed that, in known manner, such a hollow partition is generally made up of a metal frame (formed of vertical uprights and horizontal rails that are not shown) and plasterboards 1 that are fitted on at least one of the two faces of the metal frame.

As shown in FIG. 1, in this embodiment, the cavity formed in the hollow partition is formed merely by a circular opening 2 that is made, using a crown hole saw, in one of the plasterboards 1.

In the description, the terms "front" and "rear" are thus used relative to the direction in which the electrical-accessory module 130 in the circular opening 2 faces the installer. Thus, the terms "front" and "rear" designate the outwardly-facing locations of the hollow partition and the inwardly-facing locations of the hollow partition respectively.

FIG. 1 shows a particular embodiment of the electrical box 110, which embodiment makes it possible to show the way in which the electrical-accessory module 130 may be fastened in the hollow partition.

Since the electrical box 110 is not in itself the subject of the present invention, it is described only briefly.

It includes a body 111 that, in this embodiment, presents a shape that is generally cylindrical, but naturally it could present some other shape, in particular a shape that is a rectangular parallelepiped.

The body 111 comprises a side wall 112 that is circularly tubular about an axis A1, that is closed at the rear by a rear wall 113, and that is open towards the front. The body 111 thus defines an internal reception housing for receiving the electrical-accessory module 130.

In order to fasten the body 111 of the electrical box 110 in the circular opening 2 formed in the plasterboard 1, said body includes an outer collar 115 that extends externally around the edge of the front opening of the side wall 112, and that is adapted to bear against the front face of the plasterboard 1, all around the circular opening 2. Thus, the outer collar 115 makes it possible to block the body 111 of the electrical box 110 towards the rear.

In order to block it towards the front, the side wall 112 includes fastener means that are adapted to catch onto the rear of the plasterboard 1.

In this embodiment, the fastener means are formed by snap-fastener means 114 that comprise two diametrally-opposite flexible tabs 114B that are cut out in the side wall 112 of the body 111, and that each carry, on their outer faces, a snap-fastener tooth 114A.

In this particular embodiment of the electrical box 110, said electrical box is fitted with a terminal block 116 that, in this embodiment, is fastened on the inner face of its rear wall 113.

The terminal block 116 is designed firstly to be connected to electric wires 11 coming from the local electricity network, and secondly to present connection zones to which the electrical-accessory module 130 may be connected.

In this embodiment, the electric wires 11 coming from the local electricity network are three in number, and they extend from a ringed routing conduit 10 made of flexible plastics material that is situated inside the hollow partition.

They are engaged inside the electrical box 110, as far as the terminal block 116, via an insertion opening that is provided straddled over the side wall 112 and over the rear wall 113 of the body 111 of the electrical box 110.

As shown in FIG. 1, the routing conduit 10 is connected to the body 111 of the electrical box 110 by means of an endpiece 170 made of flexible plastics material.

To this end, the endpiece 170 presents a shape that is tubular, with a first end portion in which an end of the routing conduit 10 is engaged, and a second end portion that is connected to the edge of the above-mentioned insertion opening.

As shown in FIG. 1, the accessory module 130 for fitting into the electrical box 110 is designed to offer the desired electrical function to the user. It is in the form of an "all-in-one" block that is adapted to be fitted directly into the body 111 of the electrical box 110, and to be connected automatically to the terminal block 116 of the electrical box 110.

FIGS. 1 to 7 show a first embodiment of the accessory module 130. FIGS. 8 and 9, FIGS. 10 and 11, and FIGS. 12 and 13 show three variant embodiments of the accessory module 130.

Figure 8:
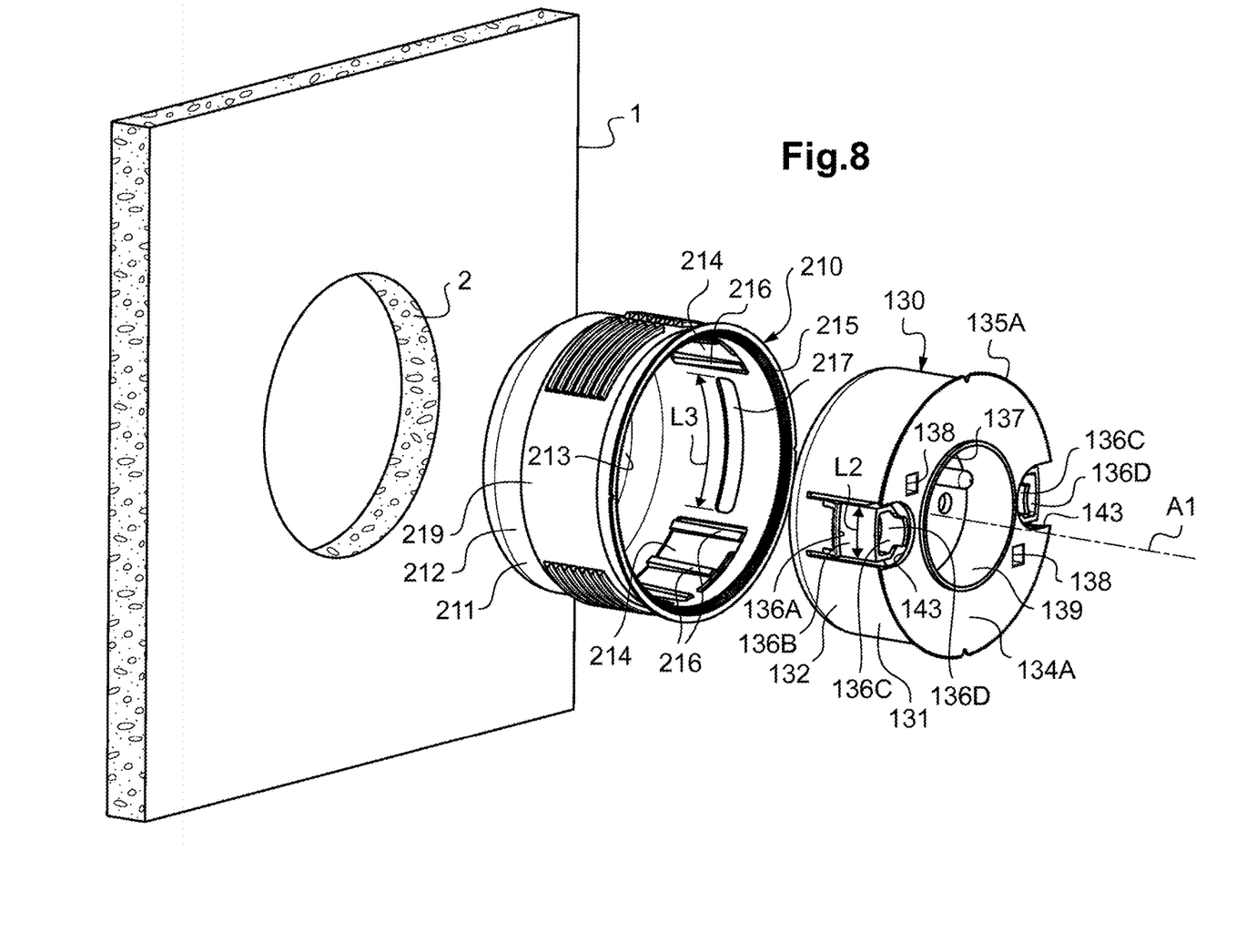
FIG. 8 is an exploded diagrammatic perspective view of a first variant embodiment of the FIG. 1 electrical accessory.
Figure 10:
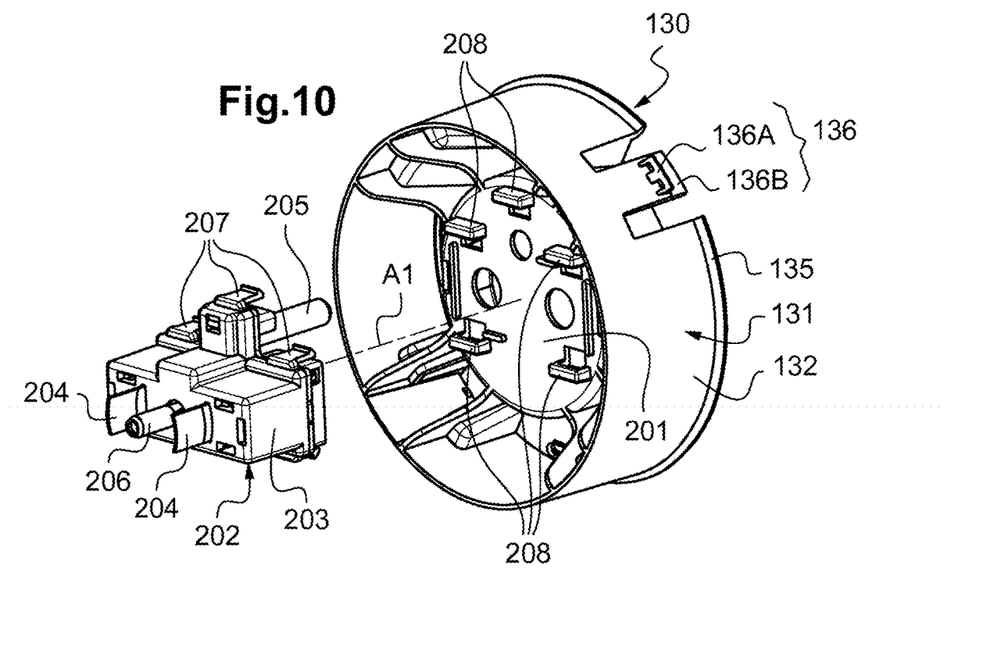
FIGS. 10 and 11 are diagrammatic perspective views of a second variant embodiment of the FIG. 2 electrical-accessory module, shown from two different angles.
Figure 12:
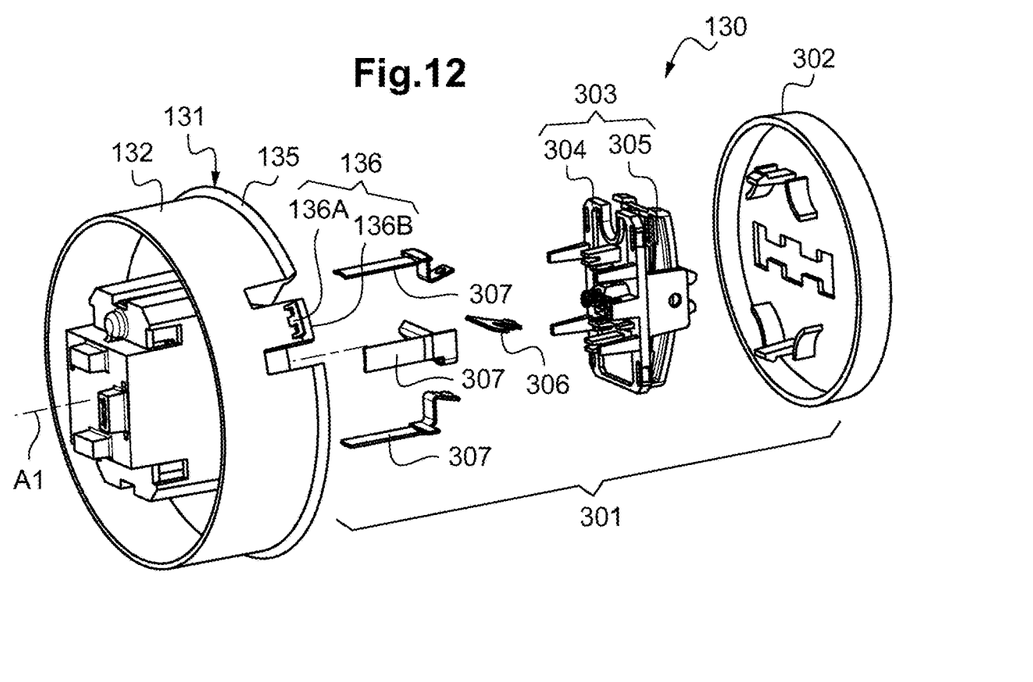
FIGS. 12 and 13 are diagrammatic perspective views of a third variant embodiment of the FIG. 2 electrical-accessory module, shown from two different angles.

In FIGS. 1, 8, and 10, the electrical-accessory module 130 presents a power-outlet function, while in FIG. 12, it presents a switch function.

In any event, and as shown in FIGS. 1, 8, 10, and 12, the electrical-accessory module 130 includes a casing 131 made of insulating material that houses an accessory mechanism (a power-outlet or switch mechanism) in such a manner that only the trim (139 in FIG. 1) of the accessory mechanism emerges at the front of the casing 131.

The casing 131 includes a side wall 132 that defines an inside space.

In the embodiment shown in FIG. 1 and in the first variant shown in FIG. 8, the side wall 132 is closed at the rear by a rear wall 133, while in the variants shown in FIGS. 10 and 12, it is open towards the rear.

The casing 131 also includes an outer collar 135 that borders the side wall 132 at the front, and that is designed to bear against the front face of the outer collar 115 of the electrical box 110.

According to a particularly advantageous characteristic of the invention, the casing 131 also includes a front wall 134 that closes said inside space at the front, and that includes firstly an access window 137 for access into the casing 131, which access window is for closing by said trim 139, and secondly securing means 138 for securing a finishing plate 150.

The access window 137 formed in the front wall 134 of the casing 131 presents a size that is smaller than the size of the front wall 134.

In the embodiment in FIG. 1, the access window 137 presents a circular outline and is off-center relative to the circular outline of the front wall 134.

Figure 11:
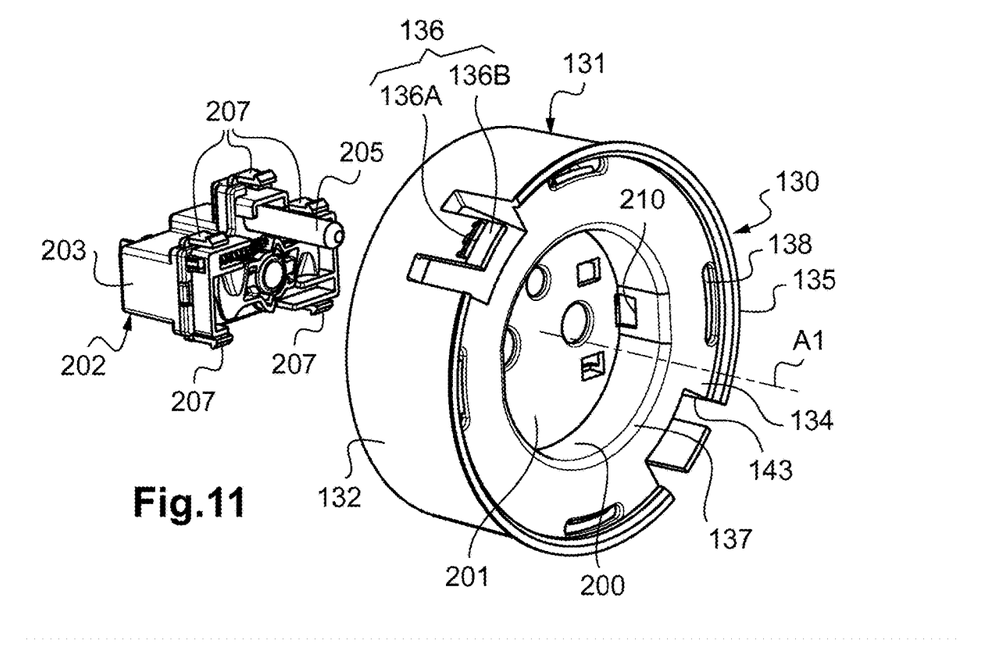

In the variant embodiments in FIGS. 8 and 11, the access window 137 presents a circular outline that is centered relative to the circular outline of the front wall 134.

Figure 13:
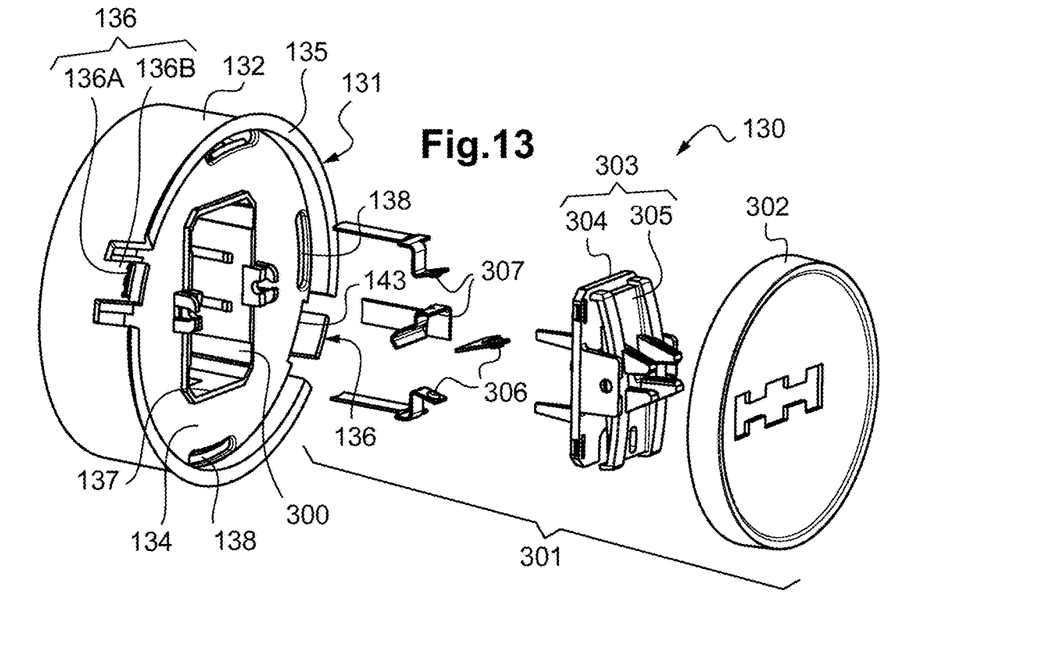

In the variant embodiment in FIG. 13, the access window 137 presents a rectangular outline that is centered relative to the circular outline of the front wall 134.

As shown in FIGS. 1, 2, 8, 10, and 12, the side wall 132 of the casing 131 presents a shape that is generally identical to the shape of the electrical box 110. It thus presents a shape that is substantially circularly-cylindrical about an axis A1.

In order to fasten it in the electrical box 110, the casing 131 of the electrical-accessory module 130 includes, in addition to the outer collar 135 that is designed to bear against the front face of the outer collar 115 of the electrical box 110, catch means 136. It also includes centering means for centering in the electrical box 110. The centering means are formed by the outer collar 135 that presents an appropriate shape for this purpose.

As shown in FIGS. 2, 8, 10, and 12, the outer collar 135 specifically presents a rear face that slopes outwards and that thus presents a shape that is frustoconical. The inner edge provided at the junction between the side wall 112 and the outer collar 115 of the electrical box 110 is thus beveled in corresponding manner, so as to present an identical frustoconical shape. In this way, when the casing 131 of the electrical-accessory module 130 is engaged in the electrical box 110, its outer collar 135 bears against the beveled edge of the electrical box 110, thereby making it possible to center the casing 131 about the axis A1 of the electrical box 110.

The catch means are formed by snap-fastener means 136 that comprise two flexible tabs 136B that are cut out in the side wall 132 of the casing 131, that each carry, on their outer faces, a snap-fastener tooth 136A, and that are movable manually so as to be released from the electrical box 110. In the embodiment shown in FIG. 1 and in the first variant shown in FIG. 8, levers 136C are provided so as to make it easier to move the two flexible tabs 136B.

As shown in FIGS. 1, 8, 11, and 13, the two flexible tabs 136B are situated in diametrally-opposite manner relative to the axis A1. They extend lengthwise from the front edge of the side wall 132 of the casing 131, to the rear. Each flexible tab 136B presents the shape of a rectangle having three edges that are free, and having a fourth edge, namely the rear edge in this embodiment, that forms the base of the flexible tab 136B in that it is connected to the remainder of the side wall 132 of the casing 131, so as to form a hinge.

Each snap-fastener tooth 136A is thus situated at a distance from the hinge. Each snap-fastener tooth 136A presents a front face that is plane and orthogonal to the axis A1, and a rear face that slopes relative to the axis A1.

The rear face of each snap-fastener tooth 136A forms a ramp that enables the flexible tab 136B to deform resiliently inwards when the casing 131 is engaged in the electrical box 110, such that the corresponding snap-fastener tooth 136A does not form an obstacle to engaging the electrical-accessory module 130 inside the electrical box 110.

The front face of each snap-fastener tooth 136A is designed to catch onto the front edge of a corresponding rectangular slot 117 provided in the side wall 112 of the electrical box 110, when the outer collar 135 of the electrical-accessory module 130 bears against the front face of the outer collar 115 of the electrical box 110 (which ensures that the module is aligned correctly relative to the box). The orientation of the front face of each snap-fastener tooth 136, and of the front edge of each rectangular slot 117 (in a plane that is orthogonal to the axis A1) makes it possible to fasten the accessory module 130 properly in the electrical box 110, and in particular to ensure its ability to withstand being pulled out when a traction force is exerted along the axis A1 on the accessory module 130.

Two distinct rectangular slots 117 are provided that each present a length L1 that is identical to the length L2 of the front face of the snap-fastener teeth 136A. Thus, when the snap-fastener teeth 136A catch onto the front edges of the rectangular slots 117, the sides of the snap-fastener teeth 136A bear against the side edges of the rectangular slots 117, thereby making it possible to prevent the casing 131 from turning at all relative to the electrical box 110, about the axis A1.

As shown in FIGS. 1, 6, 7, and 8, each of the levers 136C provided to move the flexible tabs 136B is in the form of an arch that is connected to the flexible tab 136B.

Each arch 136C comprises a wall that is semi-circular, that is connected via its two lateral end edges to the inside face of the flexible tab 136B, that is closed at the rear by a rear wall, and that is open at the front so as to define a cavity 136D in which the installer can insert a finger.

There are thus provided set back into the edge of the front wall 134 of the casing 131, and at a distance from the access window 137, two diametrally-opposite notches 143 making it possible to access the cavities 136D. The notches 143 (that are also shown in FIGS. 11 and 13) make it possible to define clearings that enable the flexible tabs 13B to flex towards the inside of the casing 131.

Figure 6:
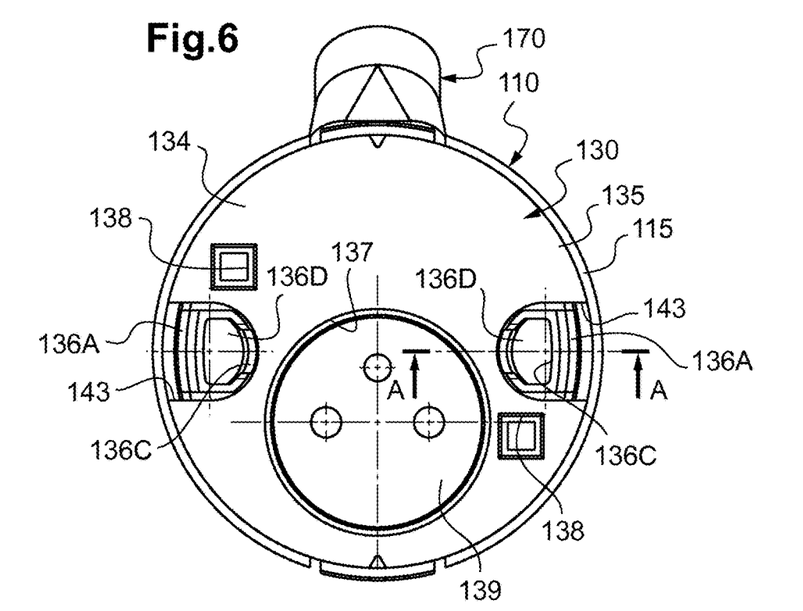
FIG. 6 is diagrammatic front view of the electrical-accessory module and of the electrical box.
Figure 7:
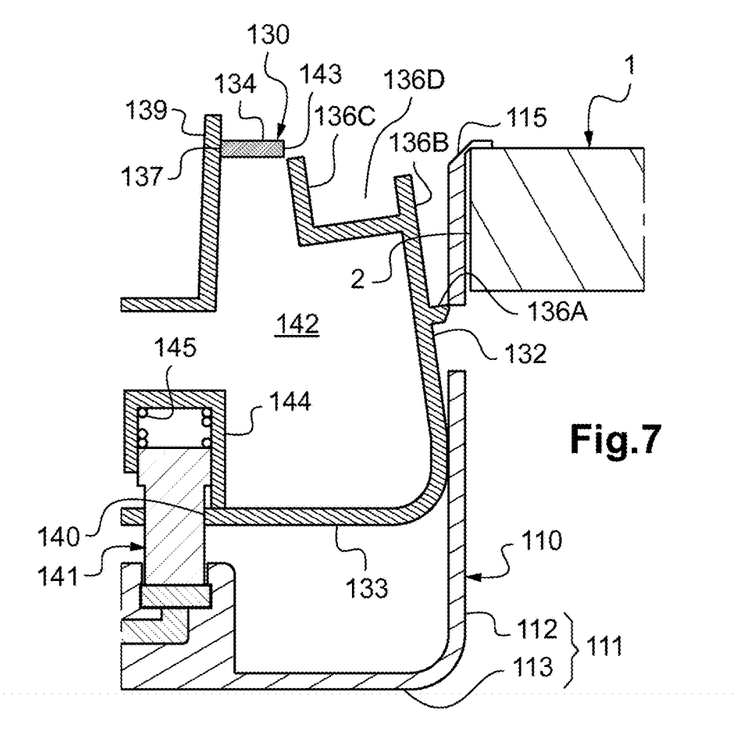
FIG. 7 is a section view on plane A-A in FIG. 6.

Thus, as shown in FIGS. 6 and 7, by inserting a thumb and a finger into these two cavities 136D, and by pinching the two levers 136C towards each other, the installer can release the flexible tabs 136B. In this way, the installer can force each snap-fastener tooth 136A to disengage from each rectangular slot 117 of the electrical box 110, thereby making it possible to extract the casing 131 from the electrical box 110.

As shown in FIGS. 1, 8, 11, and 13, the front wall 134 of the casing 131 also presents, at a distance from the access window 137 and from the notches 143, holes 138 that make it possible to secure the finishing plate 150 to the casing 131.

In the first embodiment shown in FIG. 1 and in the first variant shown in FIG. 8, two holes 138 are provided.

In the first embodiment, the finishing plate 150 is designed to border the trim 139 of the accessory mechanism, and to hide the casing 131 of the electrical-accessory module 130 in attractive manner. To this end, in this embodiment, it presents a shape that is square, with a circular opening 151 for accessing the trim 139.

Projecting from its rear face, it includes two snap-fastener lugs 158 that are provided for engaging through the square holes 138 formed in the front wall 134 of the casing 131, and for catching onto the rear face of said front wall.

Preferably, the snap-fastener lugs 158 and/or the holes 138 are serrated in such a manner that the finishing plate 150 can catch on at various depths relative to the accessory module 130. Specifically, after the electrical box 110 has been fastened in the plasterboard, it sometimes happens that said plasterboard is covered with a thick covering (wallpaper, plaster, . . . ). The serrations thus enable the finishing plate 150 to bear against the covering and to catch onto the accessory module 130 simultaneously.

As shown more particularly in FIGS. 6 and 7, since the accessory mechanism presents a power-outlet function, the trim 139 forms a reception well for receiving an electric plug.

The rear wall of the trim 139 is thus perforated with two first openings for passing the pins of the electric plug, and with a third opening for passing a ground pin of the accessory mechanism.

As shown in FIG. 7, the internal portion of the accessory mechanism, which is housed inside the casing 131, thus includes three electrical-connection terminals 141. The three electrical-connection terminals 141 are connected respectively to the ground pin and to two reception sockets for receiving the pins of the electric plug (situated at the rear of the above-mentioned two first openings). In addition, they are designed to be connected to the terminal block 116 of the electrical box 110.

Figure 2:
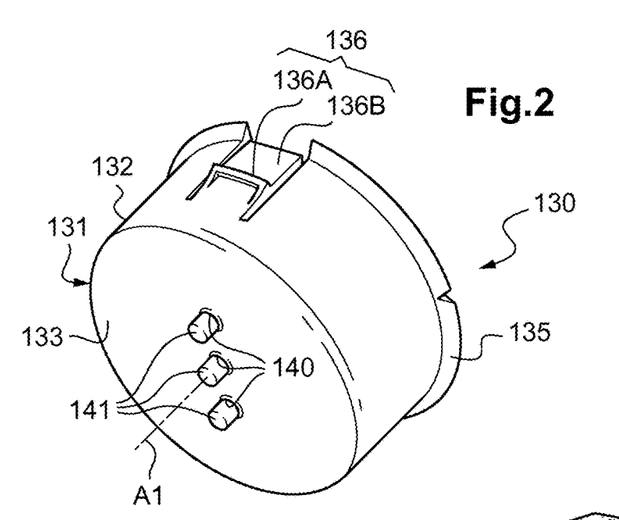
FIG. 2 is a diagrammatic perspective view of the FIG. 1 electrical-accessory module, shown from a different angle.

As shown in FIGS. 2 and 7, for this purpose, the rear wall 133 of the casing 130 presents three inlet openings 140 that are provided to enable the electrical-connection terminals 141 to be connected to the terminal block 116 of the electrical box 110.

In this embodiment, the three inlet openings 140 present shapes that are circular. In this embodiment, they enable the electrical-connection terminals 141 to project outside the casing 131.

In practice, in this embodiment, the electrical-connection terminals 141 are piston terminals, and this provides good connection between the electrical-connection terminals 141 and the terminal block 116 of the electrical box 110.

They are thus in the form of cylindrical lugs that are mounted to move in translation in reception housings provided inside the casing 131, in axes that are parallel to the axis A1, and that are urged to project outside the casing 131 by compression springs 145 that are housed in the reception housings.

In this embodiment, the reception housings are defined by internal partitions 144 formed integrally with the rear wall 133 and/or with the side wall 132 of the casing 131.

In order to close the side wall 132 at the front and the rear, the rear wall 133 and the front wall 134 of the casing 131 are thus of shapes that are substantially circular. The front wall 134 is thus bordered over its periphery by the outer collar 135.

The rear and front walls 133, 134 are made as single pieces. In this embodiment, they are made as respective single pieces by molding a plastics material. While one of them is formed integrally with at least a portion of the side wall 132, the other is snap-fastened on the side wall 132.

The electrical accessory 100 is thus installed in the circular opening 2 formed in the plasterboard 1 as follows.

The free end of the routing conduit 10 is initially pulled to the outside of the hollow partition, through the circular opening 2.

The installer thus engages the endpiece 170 at the end of the routing conduit 10, taking care to pass the three electric wires 11 through the endpiece 170.

The installer engages the free ends of the three electric wires 11 in the electrical box 110, via the insertion opening, so as to make it possible to connect them to the terminal block 116.

Figure 3:
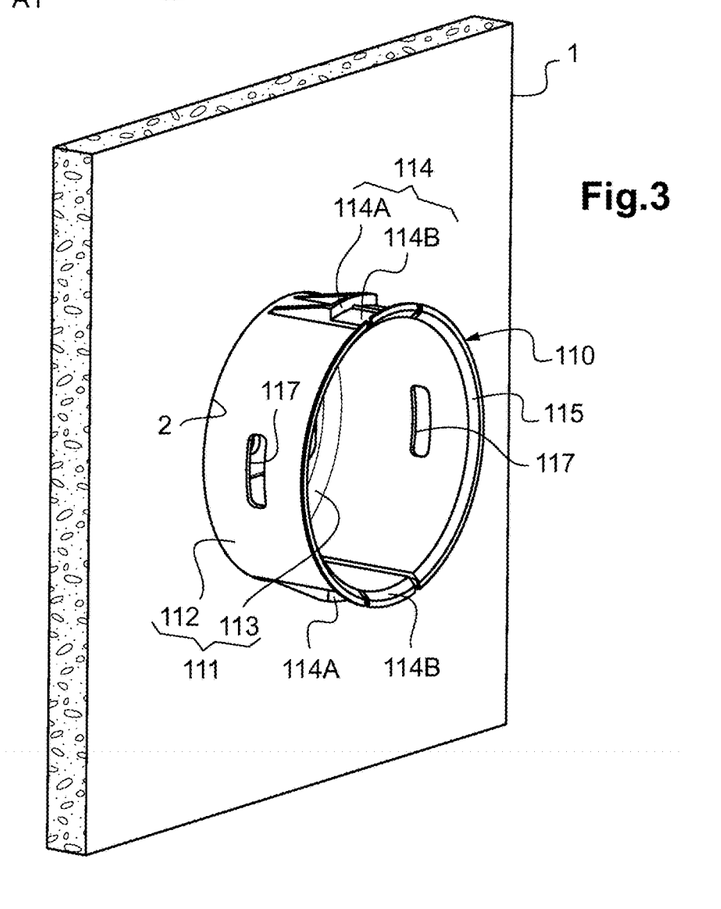
FIGS. 3 to 5 show the installation steps for installing the FIG. 1 electrical accessory in the hollow partition.

As shown in FIG. 3, the installer then fits the electrical box 110 into the circular open 2 formed in the plasterboard 1, taking care that its snap-fastener teeth 114A catch properly onto the rear of the plasterboard 1.

Figure 4:
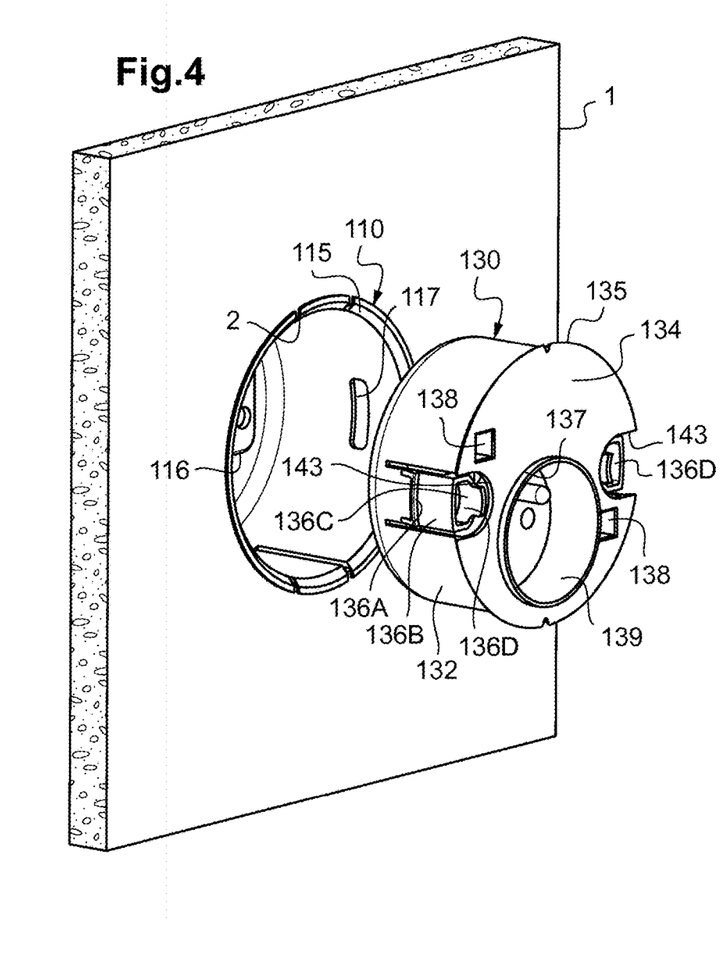

As shown in FIG. 4, the installer then fits the electrical-accessory module 130 directly into the electrical box 110, taking care that its snap-fastener teeth 136A catch properly onto the front edges of the slots 117 provided in the side wall 112 of the electrical box 110.

Figure 5:
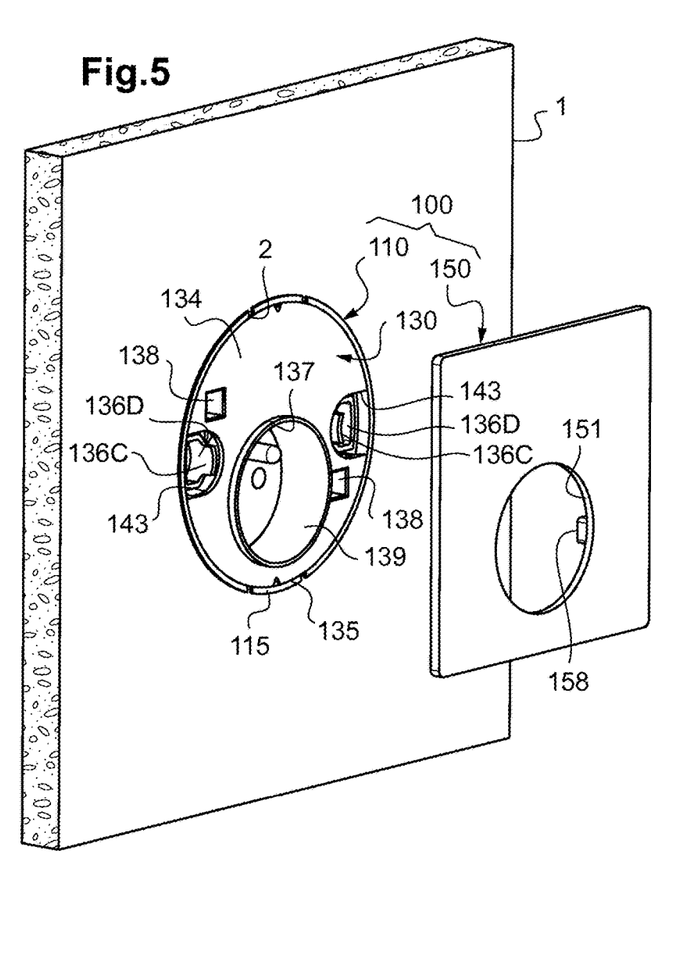

Finally, as shown in FIG. 5, the installer fits the finishing plate 150 on the front wall 134 of the casing 131 of the accessory module 130 so that its snap-fastener lugs 158 clip into the holes 138 of the front wall 134, and so that its circular opening 151 borders the trim 139 of the electrical-accessory module 130.

At a later date, the user may wish to replace the accessory module 130, e.g. with a new improved accessory module.

To do this, the user removes the finishing plate, e.g. by means of a screwdriver, then, as shown in FIGS. 6 and 7, moves the levers 236C so as to release the snap-fastener teeth 236A from the rectangular slots 117 of the electrical box 110. In this way, the user may thus remove the old accessory module 130 easily, since its electrical-connection terminals 141 are disconnected automatically.

The present invention is not limited to the embodiment described and shown in FIGS. 1 to 7, and the person skilled in the art can apply any variation thereto in accordance with the spirit of the invention.

Figure 9:
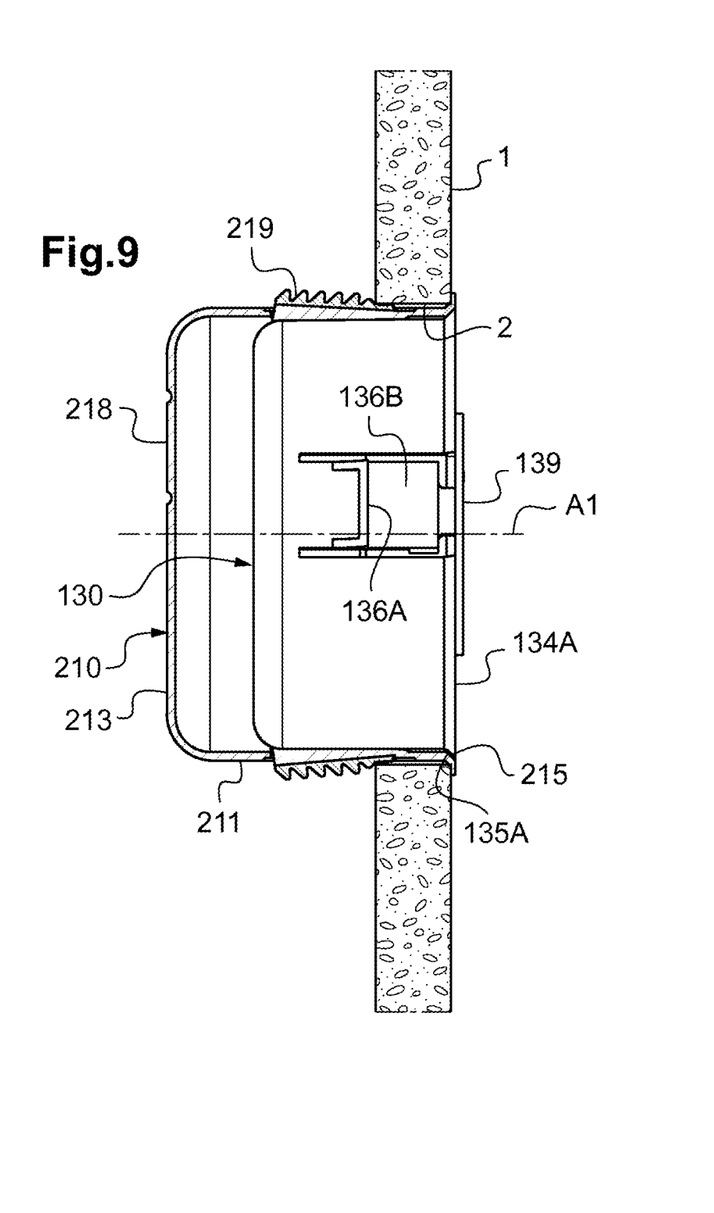
FIG. 9 is a diagrammatic section view of the FIG. 8 accessory when assembled.

Thus, FIGS. 8 and 9 show a first variant embodiment of the accessory module 130 and of the electrical box 210.

In this variant, the accessory module 130 presents a shape that is similar to the shape of the accessory module shown in FIG. 1.

It differs therefrom by the shape of its outer collar 135A having a rear face that is serrated, by the shape of its front wall 134A having a window 137A that is centered on the axis A1, and by the shape of its connection terminals (that are described below).

In contrast, the body 211 of the electrical box 210 presents a shape that is substantially different from the shape of the body 111 of the electrical box 110 shown in FIG. 1.

It thus comprises a side wall 212 that is substantially circularly cylindrical about the axis A1, a rear wall 213 that is circular, and an outer collar 215 that externally borders the edge of the front opening of the side wall 212.

In this embodiment, the inner edge provided at the junction between the side wall 212 and the outer collar 215 is beveled and serrated, so as to be capable of cooperating with the serrations of the outer collar 135A of the electrical-accessory module 130.

In addition, the rectangular slots 217 provided in the side wall 212 present lengths L3 that are significantly longer than the lengths L1 of the snap-fastener teeth 136A of the electrical-accessory module 130, such that they do not prevent said electrical-accessory module turning about the axis A1.

Thus, it is possible to adjust the angular position of the electrical-accessory module 130 relative to the electrical box 210, about the axis A1. The electrical-accessory module 130 can thus be blocked in the desired angular position by the serrations of the outer collar 135A of the electrical-accessory module 130 that cooperate with the serrations of the electrical box 110.

In this embodiment, the fastener means for fastening the electrical box 110 in the circular opening 2 provided in the plasterboard 1 are of a particular type.

Specifically, they comprise four rectangular flaps 214 that are cut out in the side wall 212 of the electrical box 210, each of said flaps having three edges that are free, and having a fourth edge, namely the front edge in this embodiment, that is connected to the remainder of the side wall 212 via two tabs that form a hinge.

Projecting from its inside face, each of the four flaps 214 includes a ramp 216 having thickness that increases going from front to rear. Thus, when the electrical-accessory module 130 is fitted into the electrical box 210, it bears against the ramps 216, thereby making it possible to deploy the flaps 214 to project from the outer face of the side wall 212.

In this embodiment, the side wall 212 carries a peripheral band 219 of compressible material that, in particular, covers the flaps 214. In this embodiment, at each of the flaps 214, the peripheral band 219 presents projecting parallel ribs.

In this way, as shown in FIG. 9, when they are deployed, the flaps 214 compress the ribs of the peripheral band 219 against the edge of the circular opening 2 formed in the plasterboard 1, thereby enabling the electrical box 210 to be fastened in the circular opening 2.

In this embodiment, the electrical box 210 does not have a terminal block. However, its rear wall 213 includes a knock-out portion 218 that makes it possible to open up a passage for the routing conduit 10.

It should thus be understood that in this variant, the electric wires 11 coming from the routing conduit 10 are connected directly to the electrical-connection terminals of the accessory module 130.

The electrical-connection terminals of the accessory module 130 (not shown in the figures) could thus be of the automatic type, e.g. being in the form of spring blades that are bent in such a manner that they define insertion and blocking sockets for inserting and blocking the stripped ends of the electric wires.

In a variant, they could be of the semi-automatic type, e.g. being in the form of metal blades fitted with movable levers, the movable levers thus being adapted to push the ends of the electric wires 11 against the metal blades so as to strip them automatically, and so as to establish the electrical connection.

In a variant, they could be of the manual type, e.g. being in the form of metal blades fitted with screws that, once screwed, compress the stripped ends of the electric wires against the metal blades so as to establish the electrical connection.

In another variant of the invention not shown in the figures, provision could be made for the fastener means for fastening the electrical-accessory module in the electrical box not to be snap-fastener means, but rather to be grip screws having grips that are adapted to catch onto the side wall of the electrical box by tightening the screws.

In another variant, the fastener means could be formed by magnets.

In still another variant of the invention, the electrical-connection terminals provided in the electrical-accessory module could be formed by stationary and non-deformable lugs, situated inside the casing (in which event the terminal block provided at the rear of the electrical box includes pins that are adapted to pass through the inlet openings provided in the rear of the casing for connecting to the terminals.

FIGS. 10 and 11 firstly, and FIGS. 12 and 13 secondly, show the second and third variant embodiments of the accessory module 130 in detail.

In these variants, the accessory module 130 is adapted to be fitted inside an electrical box 110 of the type shown in FIG. 1, then to be covered in part by a finishing plate of the type shown in FIG. 1.

In both variants, the casing 131 of the electrical-accessory module 130 thus includes a side wall 132 (still circularly cylindrical in shape) that is closed at the front by a front wall 134, but that is open at the rear. Both of these variant embodiments of the electrical-accessory module 130 operate in a manner identical to that described above, and the way in which the electrical accessory is used remains unchanged.

The main advantage is to make it possible to manufacture casings 131 with a smaller volume of first material.

In the second variant embodiment of the accessory module 130 shown in FIGS. 10 and 11, the front wall 134 of the casing 131 presents a setback 200 that extends from the edge of the window 137, towards the rear. It presents a tubular shape and is closed at the rear by a rear wall 201 in which openings are provided for passing pins.

The tubular wall of the insertion well includes two opposite side slots 210 that make it possible to fasten trim (not shown) inside the setback 200. The trim is thus designed to define an insertion well for inserting an electric plug, so as to give the accessory module 130 its power-outlet function.

In this second variant embodiment of the accessory module 130, four holes 138 are provided that make it possible to secure a finishing plate to the casing 131.

More precisely, in this embodiment, the four holes 138 are in the shape of four slots that are arcuate about the axis A1, having inner edges that carry fastener ribs.

The finishing plate (not shown) includes two or four corresponding snap-fastener tabs that are adapted to be engaged in the holes 138 so as to snap-fasten on the fastener ribs.

The accessory mechanism 202 housed in the side wall 132 of the casing 131 (in this embodiment, a power-outlet mechanism) comprises an insulating block 203 inside which three electrical-connection terminals are housed.

Inside the block 203, two of the connection terminals comprise reception sockets for receiving the pins of the electric plug, and, at the rear of the block 203, connection pins 204 for connecting to the terminal block 116 of the electrical box 110. The third of the connection terminals comprises, at the front of the block 203, a ground pin 205, and, at the rear of the block 203, a connection pin 206 for connecting to the terminal block 116 of the electrical box 110.

The block 203 is fitted with fastener means for fastening in the casing 131. In this embodiment, the fastener means are in the form of snap-fastener tabs 207 that are adapted to catch onto cavities provided in lugs 208 that extend from the rear face of the rear wall of the setback 200 provided in the front wall 134 of the casing 131.

In the third variant embodiment of the accessory module 130 shown in FIGS. 12 and 13, the front wall 134 of the casing 131 presents a setback 300 that extends from the edge of the window 137, towards the rear, and that defines a housing for housing the accessory mechanism 301.

In this embodiment, the setback 300 presents a shape that is generally a rectangular parallelepiped.

In this embodiment, the electrical mechanism 301 that is a switch mechanism, includes trim that is made of two parts. The trim is constituted by a toggle button (not shown in the figures) that is designed to be mounted in movable manner on the casing 131, and a rear plate 302 that is fastened on the casing 131. The electrical mechanism 301 also includes a toggle system 303 having a stationary portion 304 that is fastened to the casing 131, and having a movable portion 305 that is driven by the toggle button, three stationary terminals 307, and a movable contact 306 that is driven by the toggle system 303 so as to establish or open the electrical contact between the stationary terminals 307.

The electrical mechanism 301 is designed to be housed inside the casing 131 in such a manner that its trim is positioned at the front of the setback 300 (and thus closes access to the window 137), and that the stationary terminals 307 emerge a little at the rear of the setback 300.

In this embodiment, the portions of the stationary terminals 307 that emerge at the rear of the setback 300 present tab shapes for connecting to the terminal block 116 of the electrical box 110.

The invention claimed is:

1. An electrical-accessory module for engaging in an electrical box, said module including a casing that is made of insulating material and that comprises:
   a side wall that defines an inside space for receiving at least one electrical connection element suitable for connecting said electrical-accessory module to an electric wire coming from a local electricity network; and
   an outer collar that borders the side wall at the front so as to bear against the front edge of said electrical box;
   a front wall that closes said inside space at the front and that includes:
   an access window for accessing each electrical connection element, said access window being closed by trim that gives the electrical-accessory module its electrical function; and
   securing means for securing a finishing plate.

2. The electrical-accessory module according to claim 1, wherein said securing means are situated between said access window and said outer collar.

3. The electrical-accessory module according to claim 1, wherein said front wall is formed as a single piece.

4. The electrical-accessory module according to claim 1, wherein said front wall is snap-fastened on said side wall.

5. The electrical-accessory module according to claim 1, wherein said front wall is formed together with at least a portion of said side wall.

6. The electrical-accessory module according to claim 1, wherein said access window is off-center relative to the outline of said front wall.

7. The electrical-accessory module according to claim 1, wherein said side wall presents a shape that is substantially circularly-cylindrical about an axis.

8. The electrical-accessory module according to claim 1, wherein said casing includes at least one deployable member for fastening the casing to said electrical box, which deployable member is movable between a retracted position in which it does not hinder insertion of the casing into said electrical box, and a deployed position in which it is adapted to catch onto said electrical box.

9. The electrical-accessory module according to claim 8, wherein said deployable member is carried by a flexible tab that is cut out in the side wall of the casing.

10. The electrical-accessory module according to claim 8, wherein said deployable member is movable by means that are accessible through said front wall.

11. The electrical-accessory module according to claim 1, wherein the casing includes partitions that are arranged in said inside space, which partitions are formed integrally with a rear wall that closes said side wall at the rear or with the side wall, and define a housing for receiving and blocking said electrical-connection element.

12. The electrical-accessory module according to claim 1, wherein a rear wall is provided that closes said side wall at the rear, and that presents at least one inlet opening for connecting said electrical connection element to the local electricity network.

13. The electrical-accessory module according to claim 12, wherein each electrical connection element comprises a piston terminal that projects at the rear of the rear wall, through said inlet opening.

14. The electrical-accessory module according to claim 12, wherein each electrical connection element comprises a stationary and non-deformable terminal that is situated on the axis of said inlet opening.

15. The electrical-accessory module according to claim 1, wherein said outer collar presents a rear face that slopes outwards.

16. The electrical-accessory module according to claim 1, wherein said outer collar presents a rear face that is serrated at least in part.

17. The electrical-accessory module according to claim 1, wherein said outer collar presents a rear face that covers, at least partly, a front face of the front wall.

18. An electrical-accessory module for engaging in an electrical box, said module comprising:

a casing made of insulating material, the casing including i) a side wall that defines an inside space for receiving an electrical connection element suitable for connecting said electrical-accessory module to an electric wire coming from a local electricity network, ii) a rear wall that closes said side wall, the rear wall including plural inlet openings allowing connection of the electrical connection element to the local electricity network, iii) a front wall that closes said side wall at a front of the casing and closing the inside space, iv) an outer collar that borders a periphery of the front wall, wherein, with the casing mounted in the electrical box, the outer collar bears against and extends over a front edge of the side wall, v) an access window located within the front wall, the access window providing access to the electrical connection element, said access window being closed by trim that gives the electrical-accessory module an electrical function, and vi) securing means located within the front wall, the securing means for securing a finishing plate against the front wall.

19. The electrical-accessory module according to claim 18, wherein, the rear wall further includes internal partitions that each house a piston terminal that projects, at a rear of the rear wall, through said inlet openings.

20. The electrical-accessory module according to claim 18, wherein said outer collar presents a rear face that is serrated at least in part.

* * * * *